United States Patent [19]
Hunley

[11] Patent Number: 5,877,634
[45] Date of Patent: Mar. 2, 1999

[54] CMOS BUFFER WITH CONTROLLED SLEW RATE

[75] Inventor: Steven A. Hunley, Arlington, Tex.

[73] Assignee: Texas Instruments Incorporated, Dallas, Tex.

[21] Appl. No.: 52,213

[22] Filed: Apr. 23, 1993

Related U.S. Application Data

[63] Continuation of Ser. No. 776,141, Oct. 15, 1991, abandoned.

[51] Int. Cl.$^6$ .......................... H03K 19/075; H03K 17/16
[52] U.S. Cl. .................................. 326/83; 326/21; 326/33
[58] Field of Search ..................................... 307/443, 263, 307/548, 550, 270; 326/21, 33, 83

[56] References Cited

U.S. PATENT DOCUMENTS

| | | | |
|---|---|---|---|
| 4,614,882 | 9/1986 | Parker et al. | 307/263 |
| 4,622,482 | 11/1986 | Ganger | 307/263 |
| 4,857,863 | 8/1989 | Ganger et al. | 307/263 |
| 4,959,561 | 9/1990 | McDermott | 307/263 |
| 5,015,880 | 5/1991 | Drake et al. | 307/443 |
| 5,028,818 | 7/1991 | Go Ang et al. | 307/263 |
| 5,121,000 | 6/1992 | Naghshineh | 307/263 |
| 5,122,690 | 6/1992 | Bianchi | 307/263 |
| 5,138,194 | 8/1992 | Yoeli | 307/263 |

*Primary Examiner*—Michael J. Tokar
*Assistant Examiner*—Richard Roseen
*Attorney, Agent, or Firm*—Ronald O. Neerings; Richard L. Donaldson

[57] ABSTRACT

A method and apparatus for a circuit physically realizing a CMOS buffer with a controlled slew rate at the output and using no additional standby power to achieve the slew rate control is described. A feedback path from the output is coupled to transistors comprising a differential pair, the transistors are further coupled to a capacitance. The discharge rate of the capacitance and the size choices of the transistors in the circuit are used with the feedback path to control the high-to-low and low-to-high transition rate of the output. The circuit of the invention allows a system designer to construct a buffer for driving a bus with excellent on chip and bus signal noise characteristics using standard digital CMOS technology and having excellent standby and active power characteristics. An open drain buffer and a push-pull buffer are described. An integrated circuit implementing application logic coupled to input/output and output buffers embodying this circuit is disclosed. Other embodiments are also disclosed.

36 Claims, 4 Drawing Sheets

CMOS BUFFER WITH CONTROLLED SLEW RATE

This application is a Continuation of application Ser. No. 07/776,141, filed Oct. 15, 1991.

FIELD OF THE INVENTION

This invention generally relates to a method and apparatus for providing an improved controlled slew rate output circuit for use in CMOS input/output and CMOS output buffers wherein it is desirable that the rate of transition from a high/low state to a low/high state at the output be optimally controlled. An optimally controlled slew rate output circuit enables reduction of signal line reflection and ringing at the output and in the cable or connectors coupled to the output.

BACKGROUND OF THE INVENTION

Without limiting the scope of the invention, its background is described in connection with a system which implements a system interface bus which couples devices in parallel, and in connection with an output buffer circuit for use on devices coupled to a bus. The system is further described using a SCSI (Small Computer System Interface) bus as an example.

Interfacing digital systems has become increasingly difficult for the designer due to the emphasis on high-speed performance. The high-speed performance of most digital systems is now limited by distributed discontinuities and transmission line effects of packaging and interconnects, and not by the switching speed of semiconductor devices. It is becoming increasingly common for digital systems to be interfaced with electrically long cables comprised of bundled-wire or flat-wire connections. These applications are typically found in personal computers and workstations where connection to external peripheral equipment, such as disk drives, scanners, or printers, is implemented with user installed cables.

Problems are encountered when signal line reflections and high frequency ringing cause data read errors on the interface bus. The primary cause of this poor data quality is the rapid slew-rate of the I/O port output driver circuits. Typical prior art output circuits exhibit signal transition slew rates of 3 V/nsec. This rapid rate of change on the signal line will excite the resonant frequency of the bus cable as well as contribute to the strength of signal reflections. The dilemma for the prior art system designer has been that the exact characteristics of the bus signal noise cannot be predicted due to variations in physical cable length and connector impedance mismatch, and hence, signal line tuning cannot be applied to solve the problem. When the rise and fall times of the signal pulses are less than the propagation delay of the cable, transmission line effects become a serious problem to contend with. Proper design of cable terminations will eliminate some of the signal noise, however, the most dramatic reduction of these transmission line effects is achieved by making the rise and fall times of the signal pulses much slower. Controlling the slew rate of the signal driver circuit is therefore critically important in minimizing transmission line noise.

Current technologies used for digital systems bus interface include circuits designed using digital and linear CMOS processes, and digital Bi-CMOS processes. Controlled slew-rate drivers have been developed in linear CMOS and digital Bi-CMOS technologies, however these technologies are cost prohibitive, and the resulting designs typically exhibit undesirably complex circuitry as well as measurable standby power dissipation. The digital CMOS technology is attractive for bus interface driver designs due to its cost effectiveness, leakage-level standby current flow, and popularity in digital subsystems design. However, controlled slew-rate designs are very difficult to develop in digital CMOS technologies. Prior art controlled slew-rate designs utilize some form of output feed-back, and digital CMOS technology lacks the commonly used features of either the bipolar technology's junction transistors, or the linear technology's precision resistors and capacitors. Controlled slew-rate driver designs implemented without these elements exhibit widely varying performance parameters over the range of operating conditions, and hence have not been viable solutions for practical bus interface performance requirements.

Bus interface methodologies that incorporate active pull-down "open-drain" wire-ANDed driver outputs offer a partial solution by using the bus termination circuitry to passively control the low-to-high signal transition slew-rate. An example of this application is the SCSI (Small Computer System Interface) bus. This type of bus implementation, however, still exhibits undesirable transmission line noise produced by the high rate of change of the high-to-low signal transition of the prior art bus driver circuits. Accordingly, a bus driver circuit design that can be implemented in a standard digital CMOS technology as an element of an integrated circuit, and having improvements that overcome any or all of the problems of the prior art solutions, is presently desirable.

SUMMARY OF THE INVENTION

Generally, and in one form of the invention, a circuit is described which implements a controlled slew rate output buffer circuit in a standard digital CMOS process. A first embodiment is described wherein an open-drain driver circuit is coupled to a slew rate control circuit comprising P and N type MOS transistors and a capacitor. A second embodiment is described wherein the open drain circuit and the slew rate control circuit are further coupled to a pull-up circuit comprised of either active components, or passive components, to provide full push-pull output driving capacity, bus termination compensation, or both. A third preferred embodiment is described wherein the open drain circuit and the slew-rate control circuit are expanded to reflect an enhanced implementation comprising several controlling transistors for further improved output transition control and is implemented as a bidirectional input/output buffer.

An integrated circuit is described for use in a multiple chip bus system, wherein user specified application logic, either chosen from a standard ASIC or standard cell library, or specifically designed by the user, is coupled to a plurality of the input/output buffers containing the slew rate control circuitry. A system is described wherein each IC in the system contains the slew rate control circuitry and the IC's are coupled together to communicate on a multiple driver bus, such as the SCSI bus. The system thus created will exhibit superior bus noise reduction characteristics with leakage-level standby power dissipation.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

In prior art output buffer circuits, typical output drivers exhibit slew rates of 3 V/nanosecond. When used in a multiple driver bus, such as a SCSI bus, this rapid change of voltage on the signal line will excite the resonant frequency of the bus cable, as well as disadvantageously contributing to the strength of signal reflections. Because the system designer cannot predict the exact physical characteristics of the bus, due to variations in the physical length of the cable and connector impedance mismatches, signal line tuning and impedance matching techniques are not viable solutions to the problem.

When signal line reflections and high frequency ringing on the bus caused by the rapid slew rate of the drivers on the bus become severe, data on the bus becomes unreadable and is lost. One object of this invention is to provide a circuit for input/output buffers which can drive a bus while exhibiting load independent slew rates which are controlled and limited to values chosen by the designer, for a SCSI bus example operating at a frequency of 5 Mhz typical values are in the range of 0.20 V/nanosecond. A slew rate in this range will substantially reduce signal distortions due to reflections and ringing on the signal lines.

Figure 1:
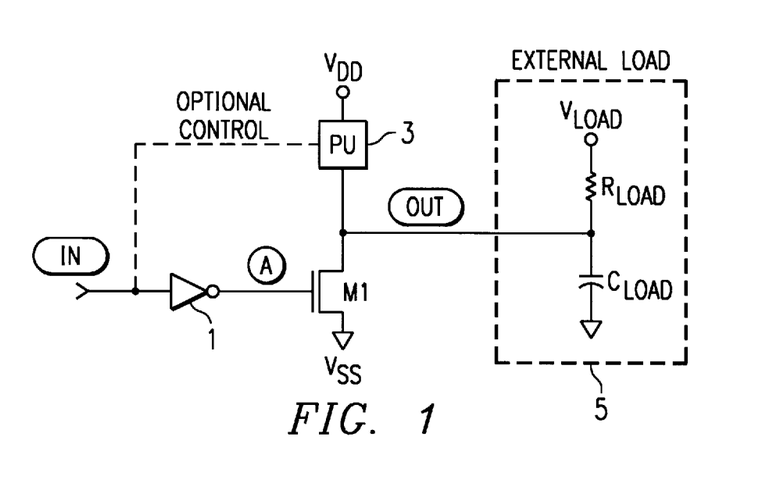
FIG. 1 is depicts a schematic diagram of a typical prior art CMOS output buffer circuitry.

FIG. 1 depicts a typical prior art CMOS output buffer which is implemented in a digital CMOS technology. Driving transistor M1 is coupled to inverter 1, which is coupled to the input. The output is coupled to the conductance path of transistor M1. Optional pull-up circuit 3 is provided in some applications, and omitted in open-drain applications. Pull-up circuit 3 may be passive, as a resistance or RC network, or active, in which case the dashed line shown in FIG. 1 is necessary to control the pull-up circuit 3. The output is coupled to the system bus which is represented as load 5, having a resistive pullup component and a capacitive load component.

Prior art designs, such as the one shown in FIG. 1, feature di/dt rate control which offer a modest degree of slew-rate control by reducing the rate of change of the turn-on current available in transistor M1. These designs incorporate techniques that weaken the drive available to the gate node of transistor M1. This technique does not compensate for the variations in signal line load capacitance and is primarily intended as a method of reducing internal on-chip ground noise. This design technique does little or nothing to reduce external signal bus noise.

Figure 1A:
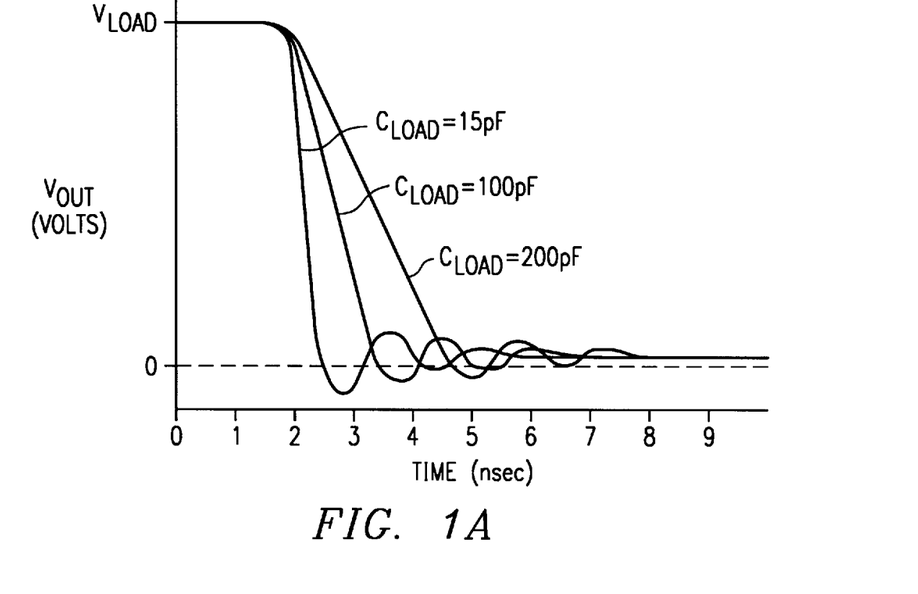
FIG. 1A is a plot of the high-to-low output transition of the prior art buffer depicted in FIG. 1 for three different load capacitances.

FIG. 1A depicts the high-to-low output characteristic of the buffer depicted in FIG. 1 for three typical capacitive loads. The circuit does not compensate for different loads, as is clearly indicated by the widely varying fall time for the different cases shown in the plot.

Figure 2:
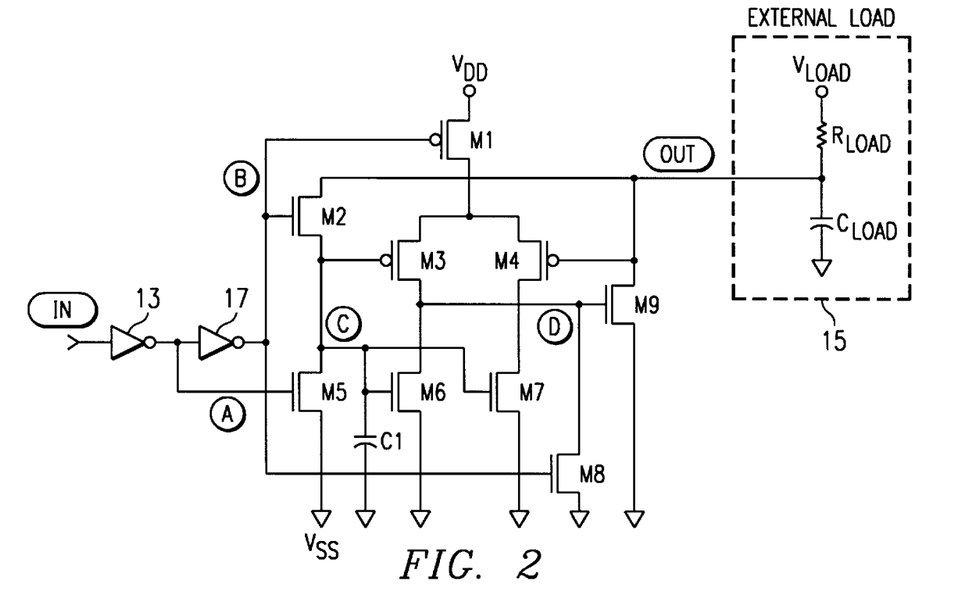
FIG. 2 is depicts a schematic diagram of an open drain output buffer embodying the slew rate control circuitry of the invention.

FIG. 2 depicts the open-drain embodiment of the circuit embodying the invention. Inverters 1 and 3 are coupled to the input. Transistor M9 provides a pull down for the output pin. Transistor M8 provides a clamping action to maintain transistor M9 in the 'off' state when the circuit is not driving the output. Transistor M2 operates to charge capacitor C1, while transistor M5 operates to discharge capacitor C1. Capacitor C1 is implemented in a typical digital CMOS process as an oxide dielectric capacitor, however other implementations of the capacitor are possible. Transistors M1, M3, M4, M7, M6, M5 and capacitor C1 operate to control the turn-on voltage of transistor M9 when the input switches, so as to control the rate at which the output node is pulled down to its low voltage level.

In operation, the circuit output (node "OUT") transitions through 4 states: a stable logic one or logic high state, a high to low transition phase, a stable logic low state, and a low to high transition phase. These phases are discussed each in turn in the paragraphs that follow.

When node "IN" is in the stable logic high state (greater that 90% of VDD), node "A" is at a logic low voltage and node "B" is at a logic high voltage. This causes the transistors M1, M3, M4, M5, and M9 to be 'off', and transistors M2, M6, M7, and M8 to be 'on'. In this state, transistor M9 in the 'off' condition results in node "OUT" being biased at the external load bias voltage, $V_{LOAD}$. Transistor M9 is held in the 'off' state by the clamping action of transistor M8, which is in the 'on' state. Because transistor M2 is 'on' and transistor M9 is 'off', the voltage present across capacitor C1 at node "C" charges the capacitor C1 up to a voltage which is equal to the voltage at node "OUT" minus the source-drain 'on' voltage drop across transistor M2. Transistors M6 and M7 are 'on', however no current flows through them since transistors M1, M3, and M4 are 'off'.

After node "IN" switches to the logic low state (less than 10% of $V_{DD}$), node "A" is at a logic high voltage and node "B" is at logic low voltage. As a result, transistors M1 and M5 turn 'on' and M2 and M8 turn 'off'. The voltage at node "C" begins to decrease as the voltage across capacitor Ct discharges through transistor M5. The resistive 'on' characteristics of transistor M5 and the magnitude of capacitor C1 are designed to yield a desired RC time constant for the discharge rate of node "C". This RC time constant will determine the high-to-low transition slew rate of the output at node "OUT".

As the voltage at node "C" decreases, transistor M3 begins to turn 'on'. This allows current to begin to flow through transistors M1, M3, and M6, and causes the voltage at node "D" to begin to increase. As the voltage at node "D" increases, transistor M9 begins to turn 'on' and the voltage at the output, node "OUT" begins to decrease. Node "OUT" connects to the gate of transistor M4 which forms feedback to the differential pair comprised of transistors M3 and M4. If the voltage at node "OUT" decreases more rapidly than the voltage discharge rate of node "C", then a situation is quickly established where node "OUT" is at a lower voltage than node "C". This will cause transistor M4 to begin to turn 'on' and current that was flowing through transistor M3 will be reduced by the amount now flowing through transistor M4. The reduction of current flowing through M3 causes a reduction in the rate of increase of the voltage at node "D". This in turn modulates the rate at which M9 is turning 'on' and thus reduces the rate at which the voltage at the output, the voltage at node "OUT" decreases. This negative feedback mechanism ensures that the rate of decrease of the voltage at the output is directly proportional to the rate of decrease of the voltage discharging across capacitor C1.

An important feature of the circuit design depicted in FIG. 2 is that during the stable state prior to the transition phase, the voltage at node "C" is very nearly equal to the output voltage at node "OUT" due to the coupling of transistor M2. This feature ensures that the response time of the feedback path is kept independent of the output load bias voltage, $V_{LOAD}$.

Another important feature of the circuit design is that the gates of transistors M6 and M7 are tied to the gate of transistor M3 at node "C". The traditional approach used in differential-pair designs would be to connect the gates of M6 and M7 to a controlled voltage source. This technique, however, would require circuitry contributing to costly DC power dissipation. Connecting the gates of M6 and M7 to node "C" provides active biasing only during the transition phase, and avoids any DC power dissipation. In addition, as the node "C" voltage decreases, the voltage increase at node "D" is dynamically increased during the critical initial turn 'on' period of transistor M3. This effect minimizes circuit propagation time variations due to processing variations.

In the final low voltage stable state, after the output high-to-low transition phase, the voltage at node "C" has discharged below the threshold voltage of transistors M6 and M7, and hence transistors M6 and M7 are 'off'. Transistors M1, M3, and M4 remain in the 'on' state and node "D" has risen to a voltage nearly equal to $V_{DD}$. Transistor M9 is 'on' in the non-saturated state with the voltage at node "OUT" being less than 0.5 volts. Since transistors M6 and M7 are clamped off by transistor M5, no current flows through the differential pair transistors M3 and M4, resulting in minimal standby power dissipation.

When node "IN" switches back to the high state, node "A" returns to logic low and node "B" returns to logic high. Transistor M1 turns 'off', immediately disabling the differential pair, M3 and M4, by shutting off their supply of source current. Transistor M8 turns 'on' which in turn begins to turn 'off' M9. The voltage at node "OUT" begins to rise at a rate dominated by the RC time constant of the external load. Transistor M5 has turned 'off' and M2 has turned 'on', allowing node "C" to begin to rise, the voltage at node "C" will thus track the voltage at the node OUT.

Transistor M5 provides a mechanism for controlling the discharge rate of capacitor C1. By choosing the size and threshold voltage of transistor M5, the designer can determine how rapidly capacitor C1 discharges in response to a transition at the input. Alternative embodiments wherein transistor M5 and capacitor C1 are replaced with a multiplicity of resistive and capacitive elements can be used to further optimize the discharge rate of C1, and thereby reduce the propagation delay time from the input transition to the turn-on of transistor M9.

Figure 2A:
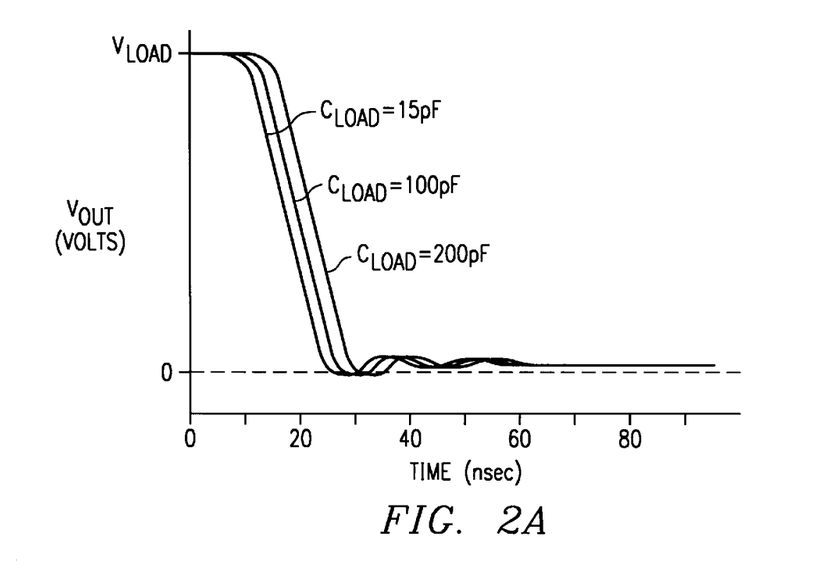
FIG. 2A is a plot of the output high-to-low transition of the output buffer depicted in FIG. 2 for three different load capacitances.

FIG. 2A depicts a plot of the high-to-low output transition characteristic of the circuit illustrated in FIG. 2 for three typical output loads. Note that the circuit compensates for the load in that the transition time for the three cases is basically the same. The transition time shown, approximately 20 nanoseconds, was chosen for an application in a system designed around the Small Computer System Interface or SCSI bus. The user may choose an appropriate transition time for any arbitrary system by designing the transistor sizes and the capacitance of capacitor C1 to get the required response using well known design techniques.

Figure 3:
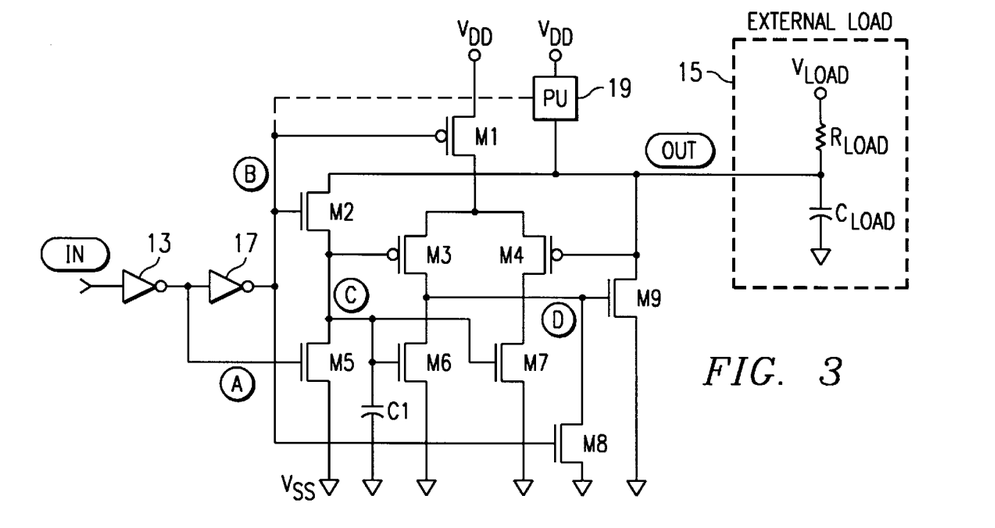
FIG. 3 is a schematic of a second preferred embodiment comprising an output buffer having the open drain driver and a pullup circuit.

FIG. 3 depicts an output buffer embodying the invention and implementing a push-pull or full range output buffer. The circuit of FIG. 3 comprises all of the elements of the circuit of FIG. 2, along with the addition of pull-up circuitry 19. In applications where the open-drain approach is not used, this embodiment provides a circuit which will drive the bus low, with controlled slew rate fall time, and drive the bus high, with the rise time determined by the load on the bus and the pull-up circuit 19.

Figure 4:
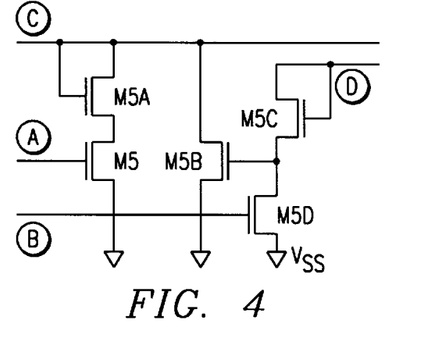
FIG. 4 is a schematic which illustrates an alternate design for the transistor M5 depicted in FIGS. 2 and 3.

FIG. 4 depicts alternative designs for the transistors M5 shown in FIGS. 2 and 3. Transistor M5 of FIGS. 2 or 3 may be replaced with the transistors M5, M5A, M5B, M5C and M5D as coupled as shown in FIG. 4 for improved performance.

Transistor M5A connected in series with transistor M5 causes the discharge target voltage of node C to be elevated by the 'on' voltage of transistor M5A, approximately 0.9 V in a typical CMOS process. The selection of this voltage for the voltage of node C ensures that transistors M6 and M7 (see FIG. 2 or 3) do not turn off during the critical period where transistor M9 is being turned on. Transistor M5C is coupled between transistor M5B and node "D" and operates to cause transistor M5B to turn on when node "D" is 0.9 V above the turn on voltage of transistor M9. This arrangement provides a means for turning off transistors M6 and M7 after the turn on period for transistor M9 is completed.

Figure 5:
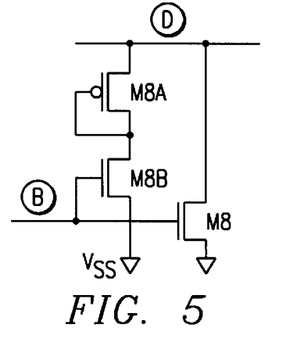
FIG. 5 is a schematic which illustrates an alternate design for the transistor M8 depicted in FIGS. 2 and 3.

FIG. 5 depicts alternative designs for the transistors M8 shown in FIGS. 2 and 3. Transistor M8 may be further coupled to transistors M8A and M8B as shown in FIG. 5 for improved performance of the circuit.

Transistor M8A is coupled in series with transistor M8B. In operation this provides a means of quickly transitioning the voltage at node "D" from a high voltage level of $V_{DD}$ minus the turn-on voltage drops of transistors M1 and M3 (see FIG.2), to a voltage level that approaches the threshold voltage of transistor M9 in FIG. 2. The key feature of transistor M8A is that its 'on' resistance increases as the voltage at node "D" approaches the threshold voltage of transistor M9 due to the body effect on transistor M8A. Transistor M8 is coupled in parallel with the series configuration of M8A and M8B to provide a weak secondary pull-down mechanism for node "D". Together transistors M8, M8A and M8B, provide a means of shaping the high-to-low transition of the voltage at node "D" so that the voltage at the gate of transistor M9 is controlled in a way that causes the transistor M9 to turn off slowly, but the shaping of the voltage at node "D" is performed in a way so that node "D" approaches the threshold voltage of transistor M9 quickly, but slowly transitions through the turn off period of transistor M9. This circuitry enables the designer to control the low-to-high transition of the output node ("OUT" in FIG. 2) so that it is slowed similarly to the high-to-low transition.

Figure 6:
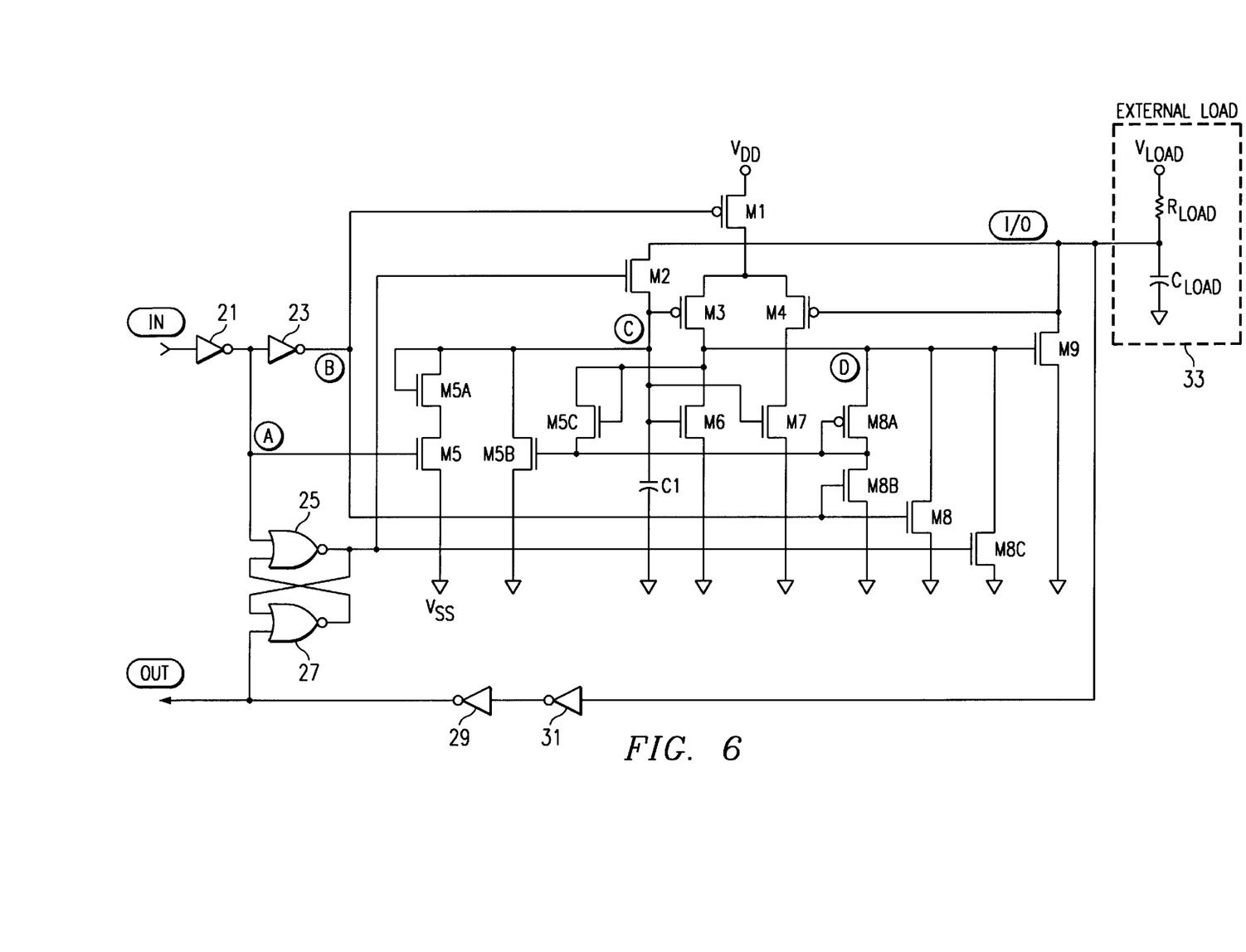
FIG. 6 is a schematic illustrating an input/output buffer having an open-drain output driver and embodying the controlled slew rate circuitry of the invention.

FIG. 6 depicts a third embodiment of the invention implementing a input/output buffer for use in an open drain bus system, such as a SCSI system. Input node "IN" is coupled to inverter 21, which is coupled to inverter 23, to provide the switching waveforms within the circuit. Transistors M3 and M4 again form a differential pair coupled to the input/output node "I/O". Transistor M9 provides the pull down path for the output node. Inverters 29 and 31 are coupled to form a non-inverting output equal to the value of the "I/O" node for use inside the integrated circuit. Gates 25 and 27 are arranged to form an "SR" latch which is coupled to the node "I/O". Transistors M8A, M8B, M8 and M8C provide the turn-off and clamping action on M9. Transistors M6, M7 and M5A, M5B, M5C, M5D are coupled to capacitor C1 to control the turn-on voltage at the gate of transistor M9. The bus load is represented by the load circuit 33, which consists of a resistance $R_{LOAD}$, a capacitance $C_{LOAD}$, and a bus termination voltage $V_{LOAD}$.

In operation, the circuit of FIG. 6 operates exactly as the circuit of FIG. 2, with the enhanced circuitry of FIGS. 4 and 5 added to improve the control of the turn on and turn off characteristics of transistor M9. The SR-latch formed by the OR gates 25 and 27 coupled to the transistor M8C provides additional noise immunity on the gate of transistor M9 by a means of feeding back the high voltage at the output node "I/O" to the gate of transistor M9, the SR-latch designed so that when the high voltage at the output node reaches a strong high value, the gate of transistor M9 is further clamped down so that noise at the output cannot cause the transistor M9 to come out of the 'off' state.

Figure 7:
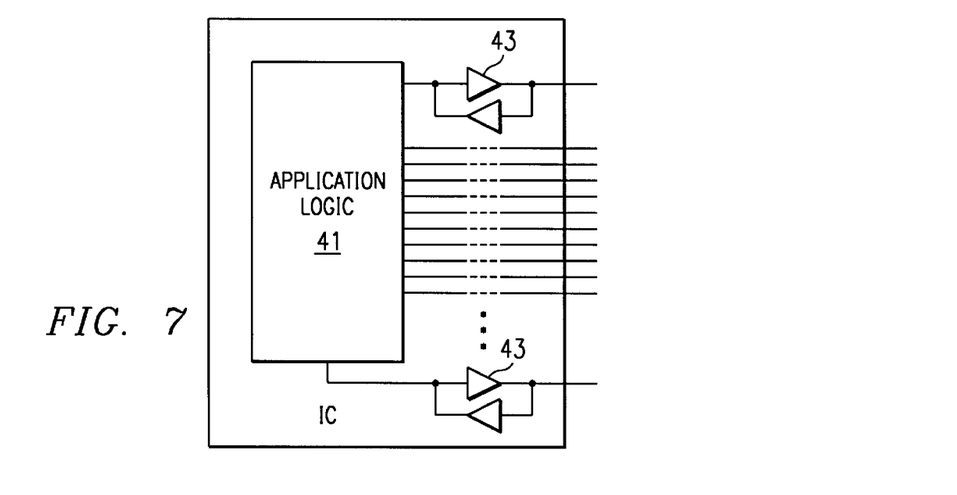
FIG. 7 is a block diagram of an integrated circuit embodying buffers which are implemented using the input/output buffer depicted in FIG. 6.

FIG. 7 depicts an integrated circuit comprising application logic 41 and output buffers 43. The application logic is specified by the user, and may be created using ASIC design tools, standard cell libraries, or specifically designed by the user. The I/O buffers 43 are each implemented using the circuit depicted in FIG. 6. This IC may be coupled to other IC's using a multiple driver bus, for example a SCSI bus, and the resulting system will exhibit excellent signal noise reduction characteristics while maintaining a leakage-level standby power for a low overall power usage for the system.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A CMOS output buffer, having improved noise reduction and standby power characteristics, comprising:
   an input terminal;
   a first voltage representative of a first logic value;
   a driving transistor coupled between an output terminal and a second voltage representative of a second logic value, and having a control terminal;
   slew rate control circuitry coupled to the input and to the control terminal of the driving transistor, wherein the slew rate control circuitry comprises:
   a first MOS transistor of a first conductance type coupled to the first voltage source, and coupled to the control terminal of the driving transistor, and having a control terminal coupled to the input;
   a first MOS transistor of a second conductance type coupled to the control terminal of the driving transistor, and further coupled to the second voltage source;
   a capacitance coupled between the control terminal of said first MOS transistor of second conductance type and the second voltage source, selectively coupled to the output or alternatively coupled to a second MOS transistor of second conductance type coupled to the second voltage source; and
   operable so that when the input is at a first voltage level the capacitance is coupled to the output and charges to the voltage level at the output, and responsive to a transition at the input to a second voltage level the capacitance discharges through the second MOS transistor determining when the control terminal of the driving transistor reaches the turn-on voltage, the voltage level transition rate at the output therefore being proportional to the predetermined rate of discharge of the capacitance through the second MOS transistor;
   slew rate compensation circuitry coupled to the output and the control terminal of the driving transistor; and
   operable to provide a buffer with a controlled transition rate at the output, the transition of the output from a voltage representing a high logic level to a voltage representing a low logic level occurring responsive to a voltage transition at the input, the rate of the transition controlled by a rate set by the slew rate control circuitry, the rate further determined by the slew rate compensation circuitry, so that the voltage level transition at the output is proportional to the predetermined rate of the slew rate control circuitry and further controlled by the slew rate compensation circuitry.

2. The CMOS buffer of claim 1, further comprising:
   clamping circuitry coupled to the input and to the control terminal of the driving transistor, and operable to control the turn off characteristics of the driving transistor responsive to a transition at the input so that the transition at the output from the second logic voltage level back to the first logic voltage level occurs at a predetermined rate.

3. The CMOS buffer of claim 2 wherein the clamping circuitry further comprises:
   a MOS transistor of a first conductance type, having a conductance path coupled between the control terminal of the driving transistor and the second voltage source, and having a control terminal coupled to the input terminal, operable to couple the control terminal of the driving transistor to the second voltage source responsive to a transition at the input.

4. The CMOS buffer of claim 2, comprising:
   a third MOS transistor of a first conductance type, having its gate and drain coupled together, and having a source terminal coupled to the control terminal of the driving transistor;
   a third MOS transistor of a second conductance type, serially coupled between the third MOS transistor of a first conductance type and the second voltage source, and having a control terminal coupled to a node which reflects the value at the input terminal;
   a fourth MOS transistor of the second conductance type having a conductance path coupled between the control terminal of the driving transistor and the second voltage source, with a control terminal coupled to a node which reflects the value at the input terminal; and operable to control the transition of the voltage at the control terminal of the driving transistor from the first voltage level to the second voltage level, so that the voltage at the control terminal of the driving transistor rapidly approaches the threshold value of the driving transistor and then slowly decreases through the threshold value of the driving transistor, turning off the driving transistor at a predetermined rate.

5. The CMOS buffer of claim 1, further comprising:

pull up circuitry coupled between the output terminal and the first voltage source, operable to cause the voltage at the output to rise to the voltage level of the first voltage source when the driving transistor is not active.

6. The CMOS buffer of claim 5, wherein the pull up circuitry comprises a passive resistance.

7. The CMOS buffer of claim 5, wherein the pull up circuitry further comprises circuitry operable to couple the output terminal to the first voltage source responsive to the transition at the input terminal.

8. The CMOS buffer of claim 7, wherein the pull up circuitry further comprises a MOS transistor having a conductance path coupled between the first voltage source and the output terminal and a control terminal coupled to a node which reflects the voltage level at the input.

9. A method of implementing an output buffer with improved noise reduction and standby power characteristics, comprising the steps of:

providing a first voltage source representative of a first logic level;

providing a second voltage source representative of a second logic level;

providing a driving transistor coupled between an output terminal and said second voltage source, and having a control terminal coupled to an input terminal;

providing a capacitance coupled to control circuitry, said control circuitry operable to selectively couple said capacitance to the output terminal and alternatively to circuitry operable to control the rate of voltage increase at said control terminal;

providing feedback compensation circuitry coupled to said output, said feedback compensation circuitry operable to control the rate of voltage level increase at said control terminal; and operating said driving transistor in response to a transition in the voltage level at the input, so that the voltage level at the control terminal transitions in response to a transition at the input at a rate proportional to the discharge rate of said capacitance, the rate at which the voltage at the control terminal increases also being inversely proportional to the rate of decrease in the voltage at the output as a result of the feedback compensation circuit, the driving transistor thus becoming conductive in a predetermined manner.

10. The method of implementing the buffer of claim 9, and further comprising the step of:

providing clamping circuitry coupled to said control terminal of said driving transistor.

11. The method of claim 10, further comprising the step of:

providing a first pull down transistor coupled to said control terminal of said driving transistor;

providing a second pull down circuit comprised of two transistors serially coupled, and coupled in parallel to said first pull down transistor;

coupling said first pull down transistor and said second pull down circuit to a node which reflects the voltage value at the input;

operating said first and second pull down circuit so that in response to a transition at the input the second pull down circuit operates to quickly transition the voltage at the control terminal of the driving transistor to a voltage near the threshold voltage of the driving transistor, the second pull down transistor operating to cause the control terminal of the driving transistor to transition through the turn off region of said driving transistor at a predetermined rate.

12. An integrated circuit having output drivers with improved noise and power characteristics, comprising:

application logic circuitry implementing a user defined function, and having output signals;

buffer circuitry having slew rate controlled output driving circuits, and having inputs coupled to said output signals and outputs coupled to output pins of said integrated circuit, wherein the buffer circuitry comprises a plurality of buffer circuits, each having:

an input terminal;

a first voltage representative of a first logic value;

a driving transistor coupled between an output terminal and a second voltage representative of a second logic value, and having a control terminal;

slew rate control circuitry coupled to the input and to the control terminal of the driving transistor, wherein the slew rate control circuitry comprises:

a first MOS transistor of a first conductance type coupled to the first voltage source, further coupled to the control terminal of the driving transistor, and having a control terminal coupled to the input;

a first MOS transistor of a second conductance type coupled to the control terminal of the driving transistor, and further coupled to the second voltage source;

a capacitance coupled between the control terminal of said first MOS transistor of second conductance type and the second voltage source, selectively coupled to the output or alternatively coupled to a second MOS transistor of second conductance type coupled to the second voltage source; and operable so that when the input is at a first voltage level the capacitance is coupled to the output and charges to the voltage level at the output, and responsive to a transition at the input to the second voltage level the capacitance discharges through the second MOS transistor, the discharge rate of the capacitance through the second MOS transistor determining the rate at which the control terminal of the driving transistor transitions through the turn-on voltage region of the driving transistor;

slew rate compensation circuitry coupled to the output and the control terminal of the driving transistor; and operable to provide a buffer with a controlled transition rate at the output, the transition of the output from the first logic level to the second logic level occurring responsive to a voltage transition at the input, the rate of the transition controlled by a rate set by the slew rate control circuitry, the rate further determined by the slew rate compensation circuitry, so that the rate of the voltage level transition at the output is proportional to the predetermined rate of the slew rate control circuitry and is further controlled by the slew rate compensation circuitry.

13. The integrated circuit of claim 12, wherein each buffer further comprises:

clamping circuitry coupled to the input and to the control terminal of the driving transistor, and operable to control the turn off characteristics of the driving transistor responsive to a transition at the input so that the transition at the output from the second voltage level back to the first voltage level occurs at a predetermined rate.

14. The integrated circuit of claim 13, wherein the clamping circuitry further comprises:

a MOS transistor of a first conductance type, having a conductance path coupled between the control terminal of the driving transistor and the second voltage source, and having a control terminal coupled to the input terminal, operable to couple the control terminal of the driving transistor to the second voltage source responsive to a transition at the input.

15. The integrated circuit of claim 13, wherein each buffer further comprises:

a third MOS transistor of a first conductance type, having its gate and drain coupled together, and having a source terminal coupled to the control terminal of the driving transistor;

a third MOS transistor of a second conductance type, serially coupled between the third MOS transistor of a first conductance type and the second voltage source, and having a control terminal coupled to a node which reflects the value at the input terminal;

a fourth MOS transistor of the second conductance type having a conductance path coupled between the control terminal of the driving transistor and second voltage source, with a control terminal coupled to a node which reflects the value at the input terminal; and operable to control the transition of the voltage at the control terminal of the driving transistor from the first voltage level to the second voltage level, so that the voltage at the control terminal of the driving transistor rapidly approaches the threshold value of the driving transistor and then slowly decreases through the threshold value of the driving transistor, turning off the driving transistor at a predetermined rate.

16. The integrated circuit of claim 12, wherein each buffer further comprises:

pull up circuitry coupled between the output terminal and the first voltage source, operable to cause the voltage eat the output to rise to the voltage level of the first voltage source when the driving transistor is not active.

17. The integrated circuit of claim 16, wherein the pull up circuitry further comprises a passive resistance.

18. The integrated circuit of claim 16, wherein the pull up circuitry further comprises circuitry operable to couple the output terminal to the first voltage source responsive to the transition at the input terminal.

19. A circuit having a controlled slew rate independent of circuit loading having a first voltage source and a second voltage source, comprising:

a charge/discharge circuit having a first input, a second input, a third input, and an output, the charge/discharge circuit also connected to the second voltage source;

an inverter receiving an input signal and outputting an inverted input signal, the input signal connected to the first input of the charge/discharge circuit and the inverted input signal connected to the second input of the charge/discharge circuit;

a differential circuit having a first input, a second input, and an output, the output of the charge/discharge circuit connected to a first input of the differential circuit;

a driving transistor having a first terminal forming a circuit output and connected to a third input of the charge/discharge circuit and a second input of the differential circuit, a second terminal connected to the second voltage source, and a control terminal connected to the output of the differential circuit; and operable to provide feedback of the rate of transition of the output from the circuit output to the differential circuit so that the differential circuit may regulate the voltage at the control terminal of the driving transistor, thus regulating the slew rate of the circuit.

20. The circuit of claim 19 wherein the charge/discharge circuit comprises:

a first switch having a terminal connected to the circuit output;

a second switch having a terminal connected to the second voltage source, connected in series with the first switch;

a capacitance having a first terminal connected between the first switch and the second switch and a second terminal connected to the second voltage source; and operable to charge to a voltage level at the circuit output and alternatively to discharge to a voltage level of the second voltage source.

21. The circuit of claim 20 wherein the first switch is an NMOS transistor having a drain terminal connected to the circuit output, a source terminal connected to the second switch, and a gate terminal connected to the input signal.

22. The circuit of claim 20 wherein the second switch is an NMOS transistor having a drain terminal connected to the first switch, a source terminal connected to the second voltage source, and a gate terminal connected to the inverted input signal.

23. The circuit of claim 20 wherein the second switch comprises:

a second NMOS transistor having a drain terminal connected to the first switch, a gate terminal connected to the first switch, and a source terminal;

a third NMOS transistor having a drain terminal connected to the source terminal of the second NMOS transistor, a gate terminal connected to the second input, and a source terminal connected to the second voltage source;

a fourth NMOS transistor having a drain terminal connected to the drain of the second NMOS transistor, a gate terminal, and a source terminal connected to the second voltage source;

a fifth NMOS transistor having a drain terminal connected to the control terminal of the driving transistor, a gate terminal connected to the control terminal of the driving transistor, and a source terminal connected to the gate terminal of the fourth NMOS transistor; and a sixth NMOS transistor having a drain terminal connected to the gate terminal of the fourth NMOS transistor, a gate terminal connected to the first input, and a source terminal connected to the second voltage source.

24. The circuit of claim 19 wherein the differential circuit comprises:

a first PMOS transistor having a source terminal connected to the first voltage source, a gate terminal connected to the input signal, and a drain terminal;

a second PMOS transistor having a source terminal connected to the drain terminal of the first PMOS transistor, a gate terminal connected to the output of charge/discharge circuit, and a drain terminal;

a seventh NMOS transistor having a drain terminal connected to the drain terminal of the second PMOS transistor, a gate terminal connected to the gate terminal of the second PMOS transistor, and a source terminal connected to the second voltage source;

a third PMOS transistor having a source terminal connected to the drain terminal of the first PMOS transistor, a gate terminal connected to the circuit output, and a drain terminal; and an eighth NMOS transistor having a drain terminal connected to the drain terminal of the third PMOS transistor, a gate terminal connected to the gate terminal of the seventh NMOS transistor, and a source terminal connected to the second voltage source.

25. The circuit of claim 19 further comprising a clamp circuit connected between the control terminal of the driving transistor and the second voltage source operable to provide a controlled turn-off rate of the driving transistor.

26. The circuit of claim 25 wherein the clamp circuit comprises:

a fourth PMOS transistor having a source terminal connected to the control terminal of the driving transistor, a drain terminal, and a gate terminal connected to its own drain terminal;

a ninth NMOS transistor having a drain terminal connected to the drain terminal of the fourth PMOS transistor, a gate terminal connected to the first input, and a source terminal connected to the second voltage source; and a tenth NMOS transistor having a drain terminal connected to the control terminal of the driving transistor, a gate terminal connected to the first input, and a drain terminal connected to the second voltage source.

27. The circuit of claim 19 wherein the driving transistor comprises an NMOS transistor having a drain terminal connected to the circuit output, a gate terminal forming the control terminal, and a source terminal connected to the second voltage source.

28. The CMOS output buffer of claim 1, wherein the slew rate compensation circuitry comprises:

a second MOS transistor of a first conductance type connected to the output terminal and the first MOS transistor of first conductance type;

a second MOS transistor of a second conductance type connected to the second MOS transistor of first conductance type and the first MOS transistor to second conductance type; and operable to sense a capacitive loading on the output by sensing a voltage on the output terminal with respect to time and modulate the current through the first MOS transistor of first conductance type and the first MOS transistor of second conductance type by activating and thus directing current away from the first MOS transistor of first conductance type and the first MOS transistor of second conductance type when the capacitive loading on the output terminal is below a predesignated capacitive loading value.

29. The CMOS output buffer of claim 12, wherein the slew rate compensation circuitry comprises:

a second MOS transistor of a first conductance type connected to the output terminal and the first MOS transistor of first conductance type;

a second MOS transistor of a second conductance type connected to the second MOS transistor of first conductance type and the first MOS transistor of second conductance type; and operable to sense a capacitive loading on the output by sensing a voltage on the output terminal with respect to time and modulate the current through the first MOS transistor of first conductance type and the first MOS transistor of second conductance type by activating and thus directing current away from the first MOS transistor of first conductance type and the first MOS transistor of second conductance type when the capacitive loading on the output terminal is below a predesignated capacitive loading value.

30. A method of controlling slew rate on an output terminal, comprising the steps of:

activating an output transistor;

comparing a voltage on the output terminal to an internal node voltage during output transistor activation; and modulating the rate of a voltage transition at the output terminal in response to the comparison of the output terminal to the internal node voltage.

31. The method of claim 30 wherein activating an output transistor comprises the step of switching an input terminal from a first voltage value to a second voltage value wherein the output transistor initiates activation in response to the input terminal switching.

32. The method of claim 30 wherein comparing the output voltage to the internal node voltage during output transistor activation comprises the steps of:

establishing the internal node voltage and its rate of transition;

monitoring the voltage transition at the output terminal; and detecting a condition of excessive output terminal voltage transition speed by comparing the relative position in time of the output terminal voltage transition to the internal node voltage transition.

33. The method of claim 32 wherein establishing the internal node voltage and its rate of transition comprises charging a capacitor to a predetermined voltage level and causing the capacitor to discharge through a resistive path.

34. The method of claim 32 wherein monitoring the voltage transition at the output terminal comprises comparing the voltage at the output terminal as it changes to the internal node voltage as it changes.

35. The method of claim 32 wherein the compared relative position in time of the output terminal voltage transition to the internal node voltage transition is directly related to a capacitive load condition which will cause a predetermined output terminal voltage transition speed in the absence of any output transistor activation modulation.

36. The method of claim 30 wherein modulating the rate of voltage transition at the output terminal comprises the steps of:

activating an internal component, whereby the activation of the internal component draws a first current; and decreasing a second current by the first current amount, whereby the second current reduction affects the output transistor control thus decreasing the transition rate at the output terminal.

* * * * *